US012666884B2

(12) United States Patent
Masago et al.

(10) Patent No.: US 12,666,884 B2
(45) Date of Patent: Jun. 23, 2026

(54) SiC SEMICONDUCTOR SUBSTRATE AND FABRICATION METHOD OF THE SiC SEMICONDUCTOR SUBSTRATE

(71) Applicant: ROHM CO., LTD., Kyoto (JP)

(72) Inventors: Noriyuki Masago, Kyoto (JP); Takuji Maekawa, Kyoto (JP); Mitsuru Morimoto, Kyoto (JP); Takayasu Oka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 271 days.

(21) Appl. No.: 18/330,447

(22) Filed: Jun. 7, 2023

(65) Prior Publication Data

US 2023/0317450 A1      Oct. 5, 2023

Related U.S. Application Data

(63) Continuation of application No. PCT/JP2021/036388, filed on Oct. 1, 2021.

(30) Foreign Application Priority Data

Dec. 10, 2020     (JP) ................................. 2020-205046

(51) Int. Cl.
 *H01L 21/02*        (2006.01)
 *H10D 62/832*      (2025.01)
       (Continued)

(52) U.S. Cl.
 CPC ..... *H10P 14/2904* (2026.01); *H10D 62/8325* (2025.01); *H10P 14/24* (2026.01);
       (Continued)

(58) Field of Classification Search
 CPC ...... H10D 62/8325; H10D 8/051; H10D 8/60; H10D 62/882
 See application file for complete search history.

(56) References Cited

U.S. PATENT DOCUMENTS

| | | | |
|---|---|---|---|
| 8,916,451 B2 | 12/2014 | Bayram et al. | |
| 2014/0220764 A1 | 8/2014 | Bayram et al. | |
| | (Continued) | | |

FOREIGN PATENT DOCUMENTS

| | | |
|---|---|---|
| DE | 102017127169 A1 | 5/2019 |
| JP | H11-26733 A | 1/1999 |
| | (Continued) | |

OTHER PUBLICATIONS

Notice of Reasons for Refusal dated Jun. 17, 2025, in corresponding Japanese patent application No. JP2022-568062 (9 pages; with English machine translation).

(Continued)

*Primary Examiner* — Suberr L Chi
(74) *Attorney, Agent, or Firm* — XSENSUS LLP

(57) ABSTRACT

A semiconductor substrate (1) includes: an SiC single crystal substrate (10SB), a first graphene layer (11GR1) disposed on an Si plane of the SiC single crystal substrate 10SB; an SiC epitaxial growth layer (12RE) formed above the SiC single crystal substrate via the first graphene layer; and a second graphene layer (11GR2) disposed on an Si plane of the SiC epitaxial growth layer. There is also included an SiC polycrystalline substrate (16P) provisionally bonded onto the SiC epitaxial growth layer via the second graphene layer. The SiC single crystal substrate is able to be reused by being separated from the SiC epitaxial growth layer. This semiconductor substrate further includes an SiC polycrystalline growth layer (18PC) CVD grown on the C plane of the SiC epitaxial growth layer; and the SiC epitaxial growth layer is transferred to the SiC polycrystalline growth layer.

20 Claims, 17 Drawing Sheets

(51) Int. Cl.
    *H10P 14/20*          (2026.01)
    *H10P 14/24*          (2026.01)

(52) U.S. Cl.
    CPC ...... *H10P 14/2926* (2026.01); *H10P 14/3206*
          (2026.01); *H10P 14/3208* (2026.01); *H10P*
       *14/3248* (2026.01); *H10P 14/3251* (2026.01);
          *H10P 14/3406* (2026.01); *H10P 14/3408*
          (2026.01); *H10P 14/3442* (2026.01); *H10P*
          *14/3444* (2026.01); *H10P 14/36* (2026.01)

(56) References Cited

U.S. PATENT DOCUMENTS

| | | | | |
|---|---|---|---|---|
| 2018/0204823 A1* | 7/2018 | Schwarz | ............. | H01L 25/0753 |
| 2019/0157395 A1* | 5/2019 | Schulze | ............ | H01L 21/02612 |

FOREIGN PATENT DOCUMENTS

| | | |
|---|---|---|
| JP | 2012-156523 A | 8/2012 |
| JP | 6206786 B2 | 10/2017 |
| JP | 2019-210161 A | 12/2019 |
| WO | 2017/044577 A1 | 3/2017 |

OTHER PUBLICATIONS

German Office Action issued Dec. 7, 2023 in corresponding German Patent Application No. 112021006001.5, 16 pages.
International Search Report and Written Opinion mailed on Nov. 16, 2021, received for PCT Application PCT/JP2021/036388, filed on Oct. 1, 2021, 13 pages including English Translation.

* cited by examiner

SiC SEMICONDUCTOR SUBSTRATE AND FABRICATION METHOD OF THE SiC SEMICONDUCTOR SUBSTRATE

CROSS-REFERENCE TO RELATED APPLICATIONS

This is a continuation application (CA) of PCT Application No. PCT/JP2021/036388, filed on Oct. 1, 2021, which claims priority to Japan Patent Application No. 2020-205046, filed on Dec. 10, 2020, the entire contents of each of which are incorporated herein by reference.

FIELD

The embodiments described herein relate to a semiconductor substrate and a fabrication method of such a semiconductor substrate.

BACKGROUND

In recent years, since Silicon Carbide (SiC) semiconductors have wider bandgap energy and has higher breakdown voltage performance at high electric field than silicon semiconductors or GaAs semiconductors, much attention has been given to such SiC semiconductors capable of realizing high breakdown voltage, high current use, low on resistance, high degree of efficiency, power consumption reduction, high speed switching, and the like.

As a method of forming an SiC wafer, for example, there are a method of forming an SiC epitaxial growth layer by a Chemical Vapor Deposition (CVD) method on an SiC single crystal substrate by a sublimation method; a method of bonding an SiC single crystal substrate by the sublimation method to an SiC CVD polycrystalline substrate and also form an SiC epitaxial growth layer on the SiC single crystal substrate by the CVD method; and the like.

Conventionally, there have been provided devices made of SiC, such as Schottky Barrier Diodes (SBDs), Metal Oxide Semiconductor Field Effect Transistors (MOSFETs), and Insulated Gate Bipolar Transistors (IGBTs), for power control applications.

SUMMARY

SiC semiconductor substrates on which such SiC based devices are formed have been sometimes fabricated by bonding a single-crystal SiC semiconductor substrate onto a polycrystal SiC semiconductor substrate in order to reduce fabricating costs or to provide desired physical properties.

In the technology of bonding the single-crystal SiC semiconductor substrate to the polycrystal SiC semiconductor substrate, it has been necessary to bond the high-quality single-crystal SiC semiconductor substrate to the polycrystal SiC semiconductor substrate without defects in order to grow up an epitaxial layer on the single-crystal SiC semiconductor substrate bonded to the polycrystal SiC semiconductor substrate. However, a polishing process for ensuring surface roughness required in order to bond the single-crystal SiC semiconductor substrate to the polycrystal SiC semiconductor substrate by room temperature bonding or diffusion bonding becomes costly, and a yield may be decreased due to film defects generated at the bonding interface therebetween.

Utilization of the above technologies is based on the premise that SiC devices are formed on an Si plane of SiC and therefore cannot avoid processes, such as provisional bonding, removal, transportation, and transfer, and each of these processes has posed a problem. Moreover, since the single crystals should be bonded to polycrystals, there have been problems such as occurrence of voids at the interface therebetween and increase in interfacial resistance. Moreover, since it is necessary to transfer a thin film of several μm, there have also been problems such as selection of provisional bonding materials, thin film transfer technology, and bonding technology between the thin film and the substrate.

The embodiments provide a semiconductor substrate which is improved in terms of the productivity, reliability and mass productivity, and a fabrication method of such a semiconductor substrate.

According to one aspect of the embodiments, there is provided a semiconductor substrate comprising: an SiC single crystal substrate; a first graphene layer disposed on an Si plane of the SiC single crystal substrate; an epitaxial growth layer disposed above the SiC single crystal substrate via the first graphene layer; and a second graphene layer disposed on an Si plane of the epitaxial growth layer.

According to another aspect of the embodiments, there is provided a fabrication method of a semiconductor substrate, the fabrication method comprising: forming a first graphene layer on an Si plane of a single crystal substrate serving as a basis; epitaxially growing a first layer formed of a single-crystal SiC semiconductor via the first graphene layer; forming a second graphene layer on an Si plane of the first layer; forming a polycrystal SiC semiconductor substrate via the second graphene layer; removing the single crystal substrate serving as the basis from the first graphene layer; eliminating the first graphene layer to expose the C plane of the first layer; forming a second layer on the C plane of the first layer by CVD growth; removing the polycrystal SiC semiconductor substrate; and eliminating the second graphene layer.

In accordance with the embodiments, there can be provided the semiconductor substrate which is improved in terms of the productivity, reliability and mass productivity, and the fabrication method of such a semiconductor substrate.

DESCRIPTION OF EMBODIMENTS

Next, certain embodiments will now be explained with reference to drawings. In the description of the following drawings to be explained, the identical or similar reference sign is attached to the identical or similar part. However, the drawings are merely schematic. Moreover, the embodiments described hereinafter merely exemplify the device and method for materializing the technical idea; and the embodiments do not specify the material, shape, structure, placement, etc. of each part as the following. The embodiments disclosed herein may be differently modified.

In the following description of the embodiments, [C] means a C plane of SiC and [S] means an Si plane of SiC.

(Semiconductor Substrate)

Figure 1A:
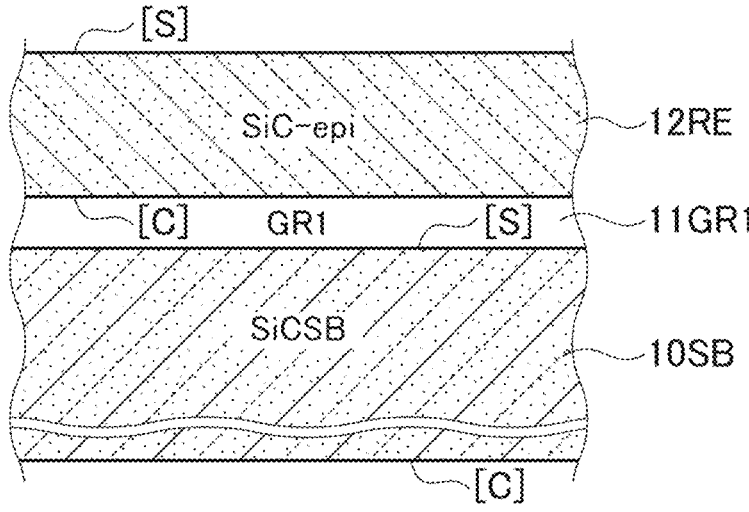
FIG. 1A is a first cross-sectional diagram illustrating a semiconductor substrate according to the embodiments.
Figure 1B:
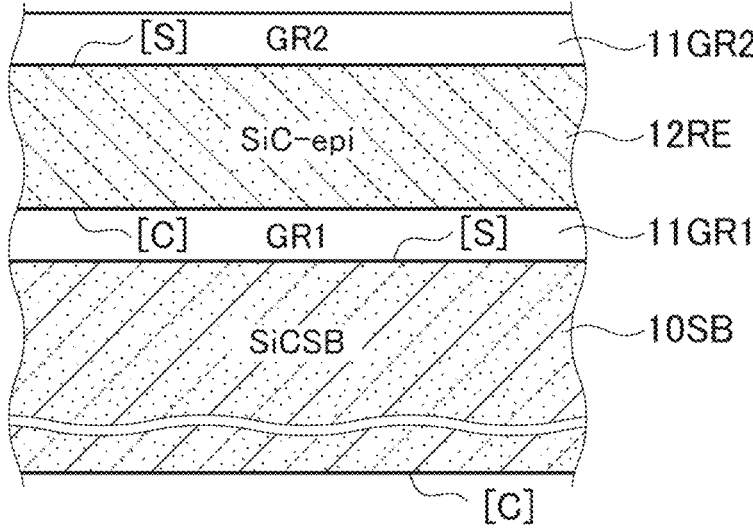
FIG. 1B is a second cross-sectional diagram illustrating the semiconductor substrate according to the embodiments.

As illustrated in FIG. 1B, a semiconductor substrate according to the embodiments includes: an SiC single crystal substrate (SiC SB) 10SB; A first graphene layer (GR1) (11GR1) disposed on an Si plane of the SiC single crystal substrate 10SB; an epitaxial growth layer (SiC-epi) 12RE disposed above the SiC single crystal substrate 10SB via the first graphene layer 11GR1; and a second graphene layer (GR2) 11GR2 formed on a Si plane of the epitaxial growth layer 12RE.

Figure 2:
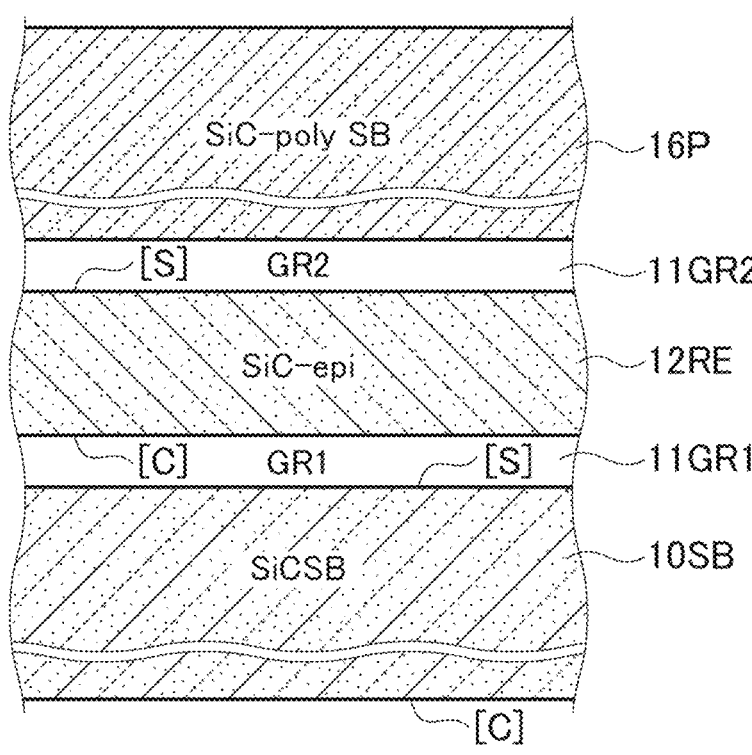
FIG. 2 is a third cross-sectional diagram illustrating the semiconductor substrate according to the embodiments.

The semiconductor substrate according to the embodiments further includes an SiC polycrystalline substrate (SiC-poly SB) 16P provisionally bonded onto the epitaxial growth layer via the second graphene layer 11GR2, as illustrated in FIG. 2.

The epitaxial growth layer 12RE is formed by remote epitaxial growth on the SiC single crystal substrate 10SB via the first graphene layer 11GR1.

Moreover, the SiC polycrystalline substrate 16P includes a sintered SiC substrate or a CVD substrate.

The SiC single crystal substrate 10SB can be reused by being removed from the epitaxial growth layer 12RE.

Figure 4A:
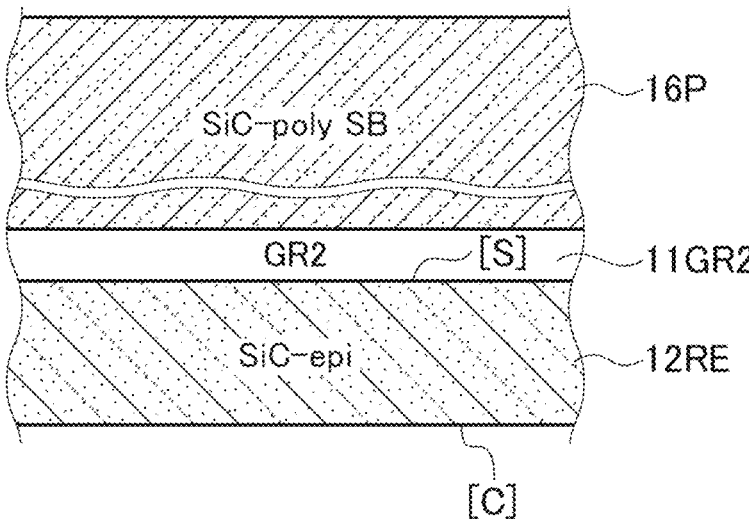
FIG. 4A is a fifth cross-sectional diagram illustrating the semiconductor substrate according to the embodiments.
Figure 4B:
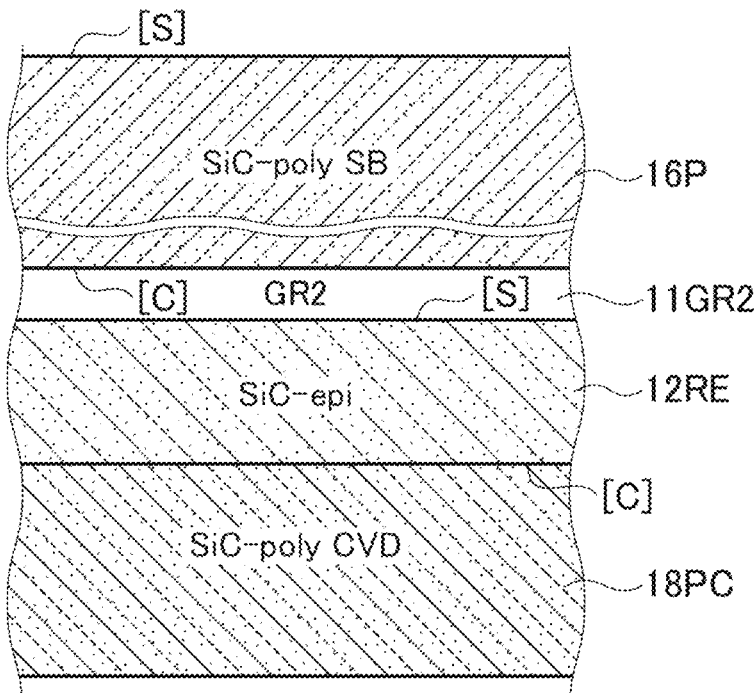
FIG. 4B is a sixth cross-sectional diagram illustrating the semiconductor substrate according to the embodiments.

As illustrated in FIG. 4B, the semiconductor substrate according to the embodiments further includes an SiC polycrystalline growth layer (SiC-poly CVD) 18PC grown by CVD on a C plane of the epitaxial growth layer 12RE, and the epitaxial growth layer 12RE is transferred to the SiC polycrystalline growth layer 18PC.

(Fabrication Method of Semiconductor Substrate)

There will now be described a fabrication method of the semiconductor substrate according to the embodiments.

(A) First, as illustrated in FIG. 1A, after forming the first graphene layer (GR1) 11GR1 on the Si plane of the SiC single crystal substrate (SiCSB) 10SB, the SiC epitaxial growth layer (SiC-epi) 12RE is formed. In this case, the SiC epitaxial growth layer 12RE is formed on the Si plane of the SiC single crystal substrate 10SB via the first graphene layer 11GR1 by using remote epitaxial growth technology. Through the remote epitaxial growth technology, a plane of the SiC epitaxial growth layer 12RE in contact with the first graphene layer 11GR1 is the C plane, and a front side surface of the SiC epitaxial growth layer 12RE is the Si plane. Moreover, the first graphene layer 11GR1 may be formed of one layer, or may be formed by laminating several layers, such as two or three layers. The first graphene layer 11GR1 can be formed, by thermal decomposition, on the Si plane of the SiC single crystal substrate 10SB by annealing the SiC single crystal substrate 10SB at approximately 1300° C. to approximately 1700° C. Alternatively, the first graphene layer 11GR1 may be formed by being laminated by CVD on the SiC single crystal substrate 10SB. The SiC single crystal substrate 10SB is, for example, a 4H—SiC substrate, and the thickness thereof is, for example, approximately 300 μm to about 600 μm.

(B) Next, as illustrated in FIG. 1B, the second graphene layer (GR2) 11GR2 is formed on the Si plane of the SiC epitaxial growth layer 12RE. The second graphene layer 11GR2 can be formed, by thermal decomposition, on the SiC epitaxial growth layer 12RE by annealing the SiC epitaxial growth layer 12RE at approximately 1300° C. to approximately 1700° C., similarly to the first graphene layer 11GR1. Alternatively, the second graphene layer 11GR2 may be formed be being laminated by CVD on the SiC epitaxial growth layer 12RE.

(C) Next, as illustrated in FIG. 2, the inexpensive SiC polycrystalline substrate (SiC-poly SB) 16P is formed so as to be bonded onto the second graphene layer 11GR2. The second graphene layer 11GR2 and the SiC polycrystalline substrate (SiC-poly SB) 16P can be easily bonded to each other if the average surface roughness Ra of the second graphene layer 11GR2 is equal to or less than 1 nm. Alternatively, if the surface of the second graphene layer 11GR2 is rough, pressure may be added between the second graphene layer 11GR2 and the SiC polycrystalline substrate (SiC-poly SB) 16P. The SiC polycrystalline substrate 16P can be formed of a sintered SiC substrate. Alternatively, a CVD SiC substrate may be applied to the SiC polycrystalline substrate 16P. A thickness of the SiC polycrystalline substrate 16P is, for example, approximately 300 μm to approximately 600 μm. It is to be noted that since the SiC polycrystalline substrate 16P is a substrate layer of devices, it is related to an on-resistance in the devices having a vertical structure. By reducing the thickness of the SiC polycrystalline substrate 16P, a series resistance can be reduced and the on-resistance can also be reduced. Accordingly, it is effective also to set the thickness of the SiC polycrystalline substrate 16P to approximately 100 μm.

Figure 3A:
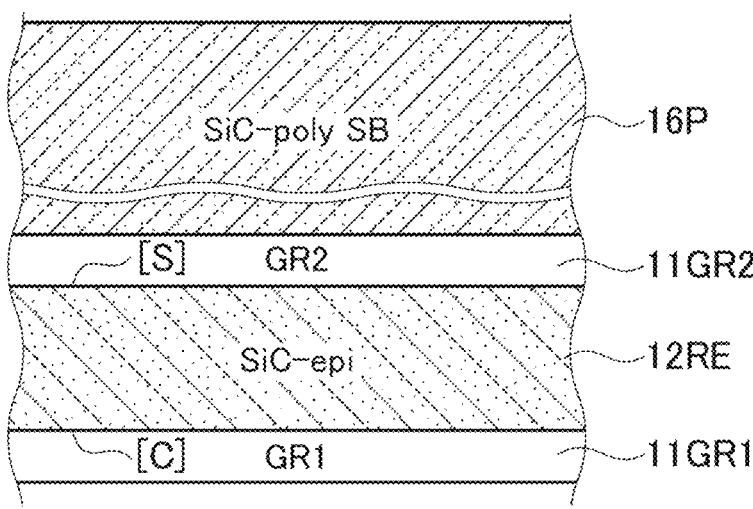
FIG. 3A is a fourth cross-sectional diagram illustrating the semiconductor substrate according to the embodiments.
Figure 3B:
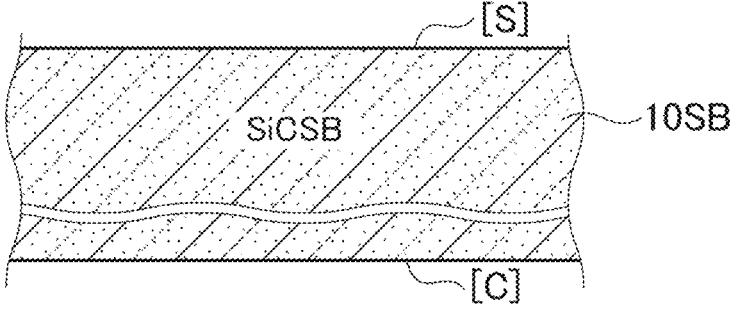
FIG. 3B is a fifth cross-sectional diagram illustrating the semiconductor substrate according to the embodiments.

(D) Next, as illustrated in FIG. 3A, the SiC single crystal substrate 10SB is removed therefrom. Specifically, it is possible to remove the SiC single crystal substrate 10SB therefrom by fixing the SiC polycrystalline substrates 16p/the second graphene layer 11GR2/the SiC epitaxial growth layer 12RE/the first graphene layer 11GR1 side and applying a force in a shearing direction. Since the first graphene layer 11GR1 is bonded to the surface of the SiC single crystal substrate 10SB by Van der Waals force, the first graphene layer 11GR1 can be easily removed therefrom by applying the force in the shearing direction. FIG. 3B illustrates a cross-sectional diagram of the removed SiC single crystal substrate 10SB. A front side surface of the removed SiC single crystal substrate 10SB has the Si plane and a back side surface thereof has the C plane. The SiC single crystal substrate 10SB can be easily removed from the first graphene layer 11GR1. The front side surface of the removed SiC single crystal substrate 10SB has a cleaned Si plane. Therefore, the removed SiC single crystal substrate 10SB is recyclable as the SiC single crystal substrate (SiCSB) 10SB illustrated in FIG. 1A.

(E) Next, as illustrated in FIG. 4A, the first graphene layer 11GR1 is eliminated by etching. To an etching process of first graphene layer 11GR1, for example, a plasma asher using oxygen plasma can be applied. Since a front side surface of the C plane of the SiC epitaxial growth layer 12RE where the first graphene layer 11GR1 is etched by the oxygen plasma is oxidized and roughness is formed, wet etching by HF is performed thereon. In this case, the C plane of the SiC epitaxial growth layer 12RE has an average surface roughness Ra of, for example, equal to or less than approximately 1 nm after performing the above-mentioned wet etching process.

(F) Next, as illustrated in FIG. 4B, the SiC polycrystalline growth layer (SiC-poly CVD) 18PC is formed on the C plane of the SiC epitaxial growth layer 12RE. The SiC polycrystalline growth layer 18PC can be formed by, for example, CVD technique. The SiC polycrystalline growth layer 18PC has a 3C (cubic) structure. In the embodiment, the thickness of the SiC polycrystalline growth layer 18PC is, for example, approximately 200 μm to approximately 500 μm, and the thickness of the SiC epitaxial growth layer 12RE is, for example, approximately 4 μm to approximately 100 μm. A substrate layer of device wafer structure is formed by forming the SiC polycrystalline growth layer 18PC on the C plane of the SiC epitaxial growth layer 12RE. Since the C plane of the SiC epitaxial growth layer 12RE is a back side surface of the device wafer structure, surface flatness thereof is not much required.

Therefore, the SiC polycrystalline growth layer 18PC can be formed by a simple polishing process.

Figure 5:
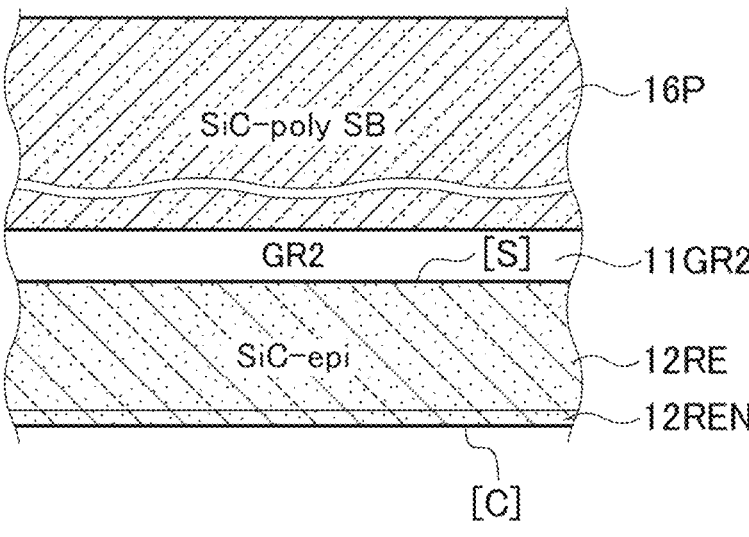
FIG. 5 is a seventh cross-sectional diagram illustrating the semiconductor substrate according to the embodiments.

(G) In addition, as illustrated in FIG. 5, a highly doped layer 12REN may be formed on the C plane of the SiC epitaxial growth layer 12RE. The highly doped layer 12REN suppresses a depletion layer spreading in the SiC epitaxial growth layer 12RE and also facilitates the ohmic contact with the SiC polycrystalline growth layer (CVD) 18PC formed on the C plane of the SiC epitaxial growth layer 12RE.

The highly doped layer 12REN can be formed, using, for example a high-dosage ion implantation technique. For example, in a case of an n type semiconductor, the highly doped layer 12REN is formed by ion implantation of phosphorus (P) with high dosage amount. In the case of forming the highly doped layer by phosphorus ion implantation, there is an effect on the crystallinity on the C plane of the SiC epitaxial growth layer 12RE subjected to the phosphorus ion implantation, but the Si plane to be a device surface has already been formed and therefore the crystallinity of the Si plane is preserved.

Alternatively, the highly doped layer 12REN may be formed by forming the highly nitrogen (N)-doped epitaxial growth layer in an initial stage during the formation of the SiC epitaxial growth layer (SiC-epi) 12RE illustrated in FIG. 1A. In the highly nitrogen (N)-doped epitaxial growth layer, there is an effect on crystallinity due to mismatching of lattice constant, but the process is easy since it is formed by autodoping in the initial stage of the epitaxial growth.

Figure 6A:
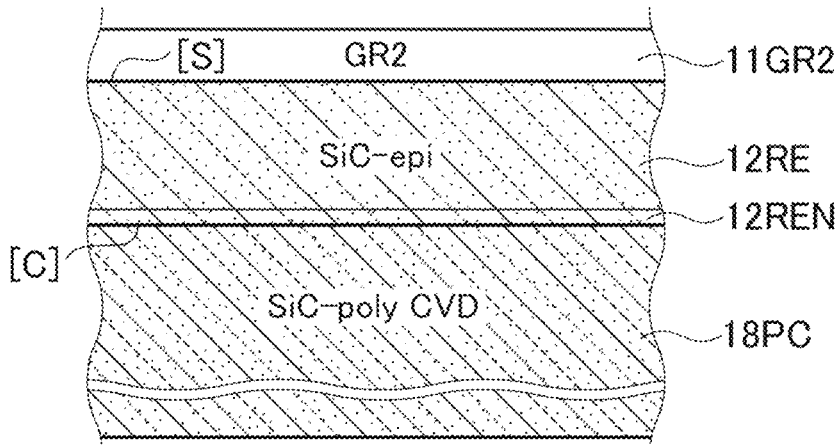
FIG. 6A is an eighth cross-sectional diagram illustrating the semiconductor substrate according to the embodiments.

(H) Next, as illustrated in FIG. 6A, the second graphene layer 11GR2/the SiC epitaxial growth layer 12RE/the SiC polycrystalline growth layer 18PC side is fixed in the structure illustrated in FIG. 4B, and the SiC polycrystalline substrate 16P is removed therefrom. The SiC polycrystalline substrate 16P can be easily removed therefrom since it is bonded to the SiC epitaxial growth layer 12RE via the second graphene layer 11GR2. Since the second graphene layer 11GR2 is bonded to the front side surface of the SiC polycrystalline substrate 16P by Van der Waals force, the second graphene layer 11GR2 can be easily removed therefrom by applying a force in the shearing direction.

Figure 6B:
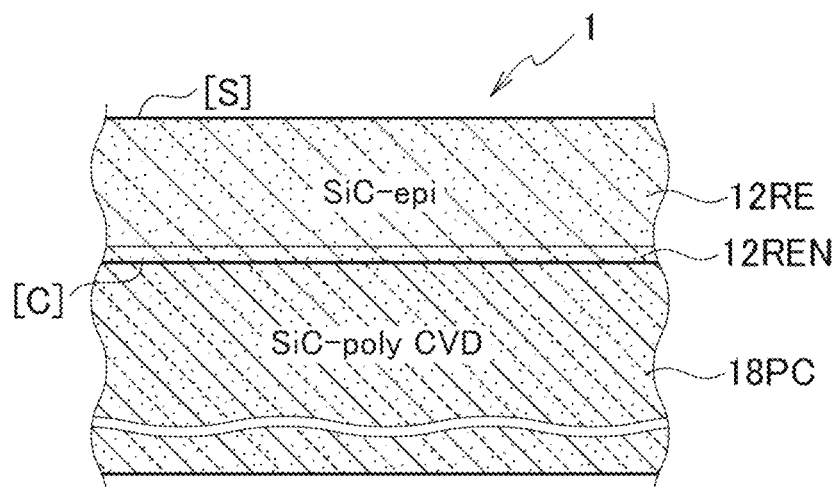
FIG. 6B is a ninth cross-sectional diagram illustrating the semiconductor substrate according to the embodiments.

(I) Next, as illustrated in FIG. 6B, the second graphene layer 11GR2 formed on the S plane of the SiC epitaxial growth layer 12RE is eliminated therefrom by etching. To also the etching process of the second graphene layer 11GR2, for example, oxygen plasma can be applied. Since a front side surface of the S plane of the SiC epitaxial growth layer 12RE where the SiC epitaxial growth layer is etched by the oxygen plasma is oxidized and roughness is formed, wet etching by HF is performed thereon. In this case, the S plane of the SiC epitaxial growth layer 12RE has a surface roughness Ra of, for example, equal to or less than approximately 1 nm after performing the above-mentioned wet etching process.

According to the above-mentioned processed, the semiconductor substrate according to the embodiments 1 can be formed.

As illustrated in FIG. 6B, the semiconductor substrate according to the embodiments 1 includes the SiC epitaxial growth layer 12RE, and the SiC polycrystalline growth layer 18PC formed on the C plane of the SiC epitaxial growth layer 12RE.

In accordance with the embodiments, even if the remote epitaxial growth technology is applied to the formation of the Si plane required for SiC based devices, the processes of removal, transfer, and bonding can be reduced.

In accordance with the fabrication method of the semiconductor substrate according to the embodiments, no thin film transfer technology is necessary, and no provisionally bonding material for the thin-film transfer is necessary, thereby realizing cost reduction.

In accordance with the embodiments, since no substrate bonding technology is applied, interface reliability can be improved by void-less.

In accordance with the fabrication method of the semiconductor substrate according to the embodiments, it is effective also in reuse of a seed substrate, and it can provide the semiconductor substrate having high substrate quality at the time of being reused and the fabrication method of the semiconductor substrate.

In accordance with the fabrication method of the semiconductor substrate according to the embodiments, the reuse times of the seed substrate can be increased and thereby cost reduction can be realized.

Comparative Example

There will now be described a semiconductor substrate according to a comparative example and a fabrication method of such a semiconductor substrate.

Figure 7A:
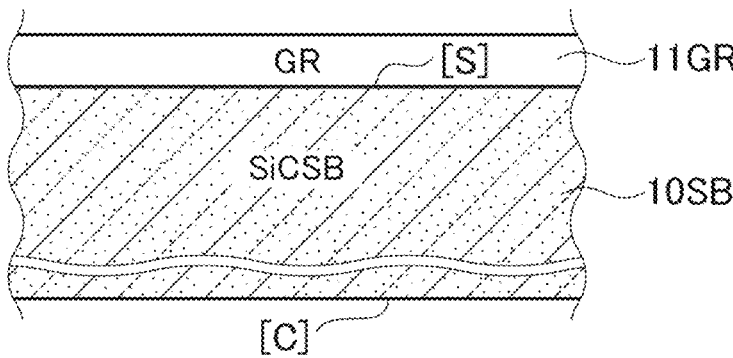
FIG. 7A is a first cross-sectional diagram illustrating a semiconductor substrate according to a comparative example.

(A) First, as illustrated in FIG. 7A, a graphene layer (GR) 11GR is formed on a Si plane of an SiC single crystal substrate (SiCSB) 10SB.

Figure 7B:
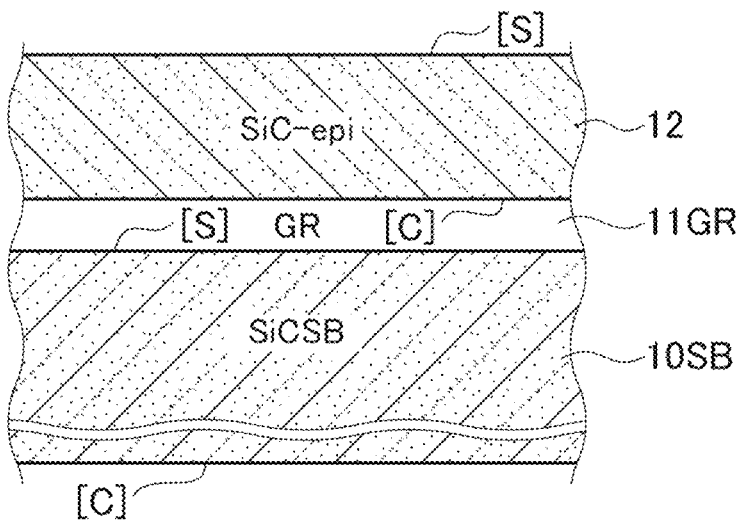
FIG. 7B is a second cross-sectional diagram illustrating the semiconductor substrate according to the comparative example.

(B) Next, as illustrated in FIG. 7B, an SiC epitaxial growth layer (SiC-epi) 12 is formed on the graphene layer 11GR. In this case, the SiC epitaxial growth layer 12 is formed on the Si plane of the SiC single crystal substrate 10SB via the graphene layer 11GR by using remote epitaxial growth technology. Through the remote epitaxial growth technology, a plane of the SiC epitaxial growth layer 12 in contact with the first graphene layer 11GR is the C plane, and a front side surface of the SiC epitaxial growth layer 12 is the Si plane.

Figure 8A:
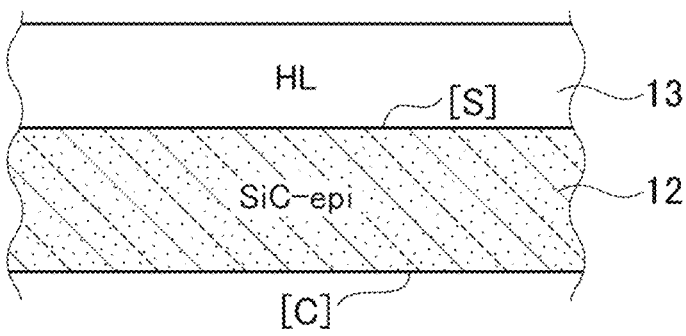
FIG. 8A is a third cross-sectional diagram illustrating the semiconductor substrate according to a comparative example.

(C) Next, as illustrated in FIG. 8A, the SiC epitaxial growth layer 12 is removed therefrom, after forming a handling layer (HL) 13 on the SiC epitaxial growth layer 12.

Figure 8B:
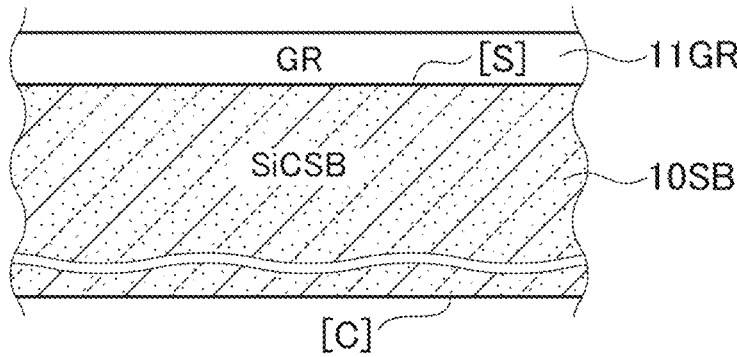
FIG. 8B is a fourth cross-sectional diagram illustrating the semiconductor substrate according to the comparative example.

(D) The removed substrate includes the SiC single crystal substrate 10SB and the graphene layer (GR)11GR disposed on the SiC single crystal substrate 10SB, as illustrated in FIG. 8B. Therefore, the removed substrate is recyclable as an initial substrate, as illustrated in FIG. 7A.

Figure 8C:
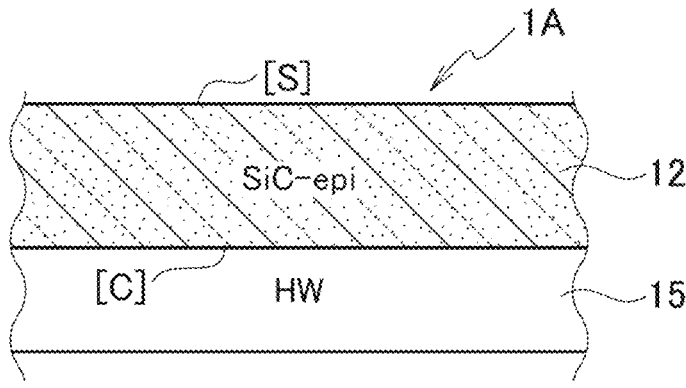
FIG. 8C is a fifth cross-sectional diagram illustrating the semiconductor substrate according to the comparative example.

(E) Next, the SiC epitaxial growth layer 12 and the handling layer (HL) 13 are transported, and the handling layer (HL) is transferred to an inexpensive host wafer (HW) 15 as illustrated in FIG. 8C. Specifically, after bonding the host wafer (HW) 15 on the C plane of the SiC epitaxial growth layer 12 illustrated in FIG. 8A, the handling layer (HL) 13 is removed from the SiC epitaxial growth layer 12. As a result, the semiconductor substrate 1A according to the comparative example includes the host wafer 15 and the SiC epitaxial growth layer 12 disposed on the host wafer (HW) 15. The plane of the SiC epitaxial growth layer 12 in contact with the host wafer (HW) 15 is the C plane, and the front side surface of the SiC epitaxial growth layer 12 is the Si plane.

In the fabrication method of the semiconductor substrate according to the comparative example, it is necessary to handle the SiC epitaxial growth layer 12RE at processes, such as provisionally bonding, removal, transportation, and transfer, which poses problems in terms of productivity, reliability, and mass productivity. In particular, since the SiC devices are generally formed on the Si plane, such processes cannot be avoided.

In contrast, in the fabrication method of the semiconductor substrate according to the embodiments, the provisional SiC polycrystalline substrate 16P is formed after forming the second graphene layer 11GR2 on the Si plane of the SiC epitaxial growth layer 12RE, then the SiC single crystal substrate 10SB is removed therefrom, thereby making it possible to recycle the SiC single crystal substrate 10SB. Moreover, the SiC polycrystalline growth layer 18PC is formed on the C plane of the SiC epitaxial growth layer 12RE, and the epitaxial growth layer 12RE is transferred to the SiC polycrystalline growth layer 18PC.

(Fabricating Apparatus for SiC Sintered Body)

In the fabrication method of the semiconductor substrate according to the embodiments, the SiC polycrystalline substrate 16P can be formed of a sintered SiC substrate.

Figure 9:
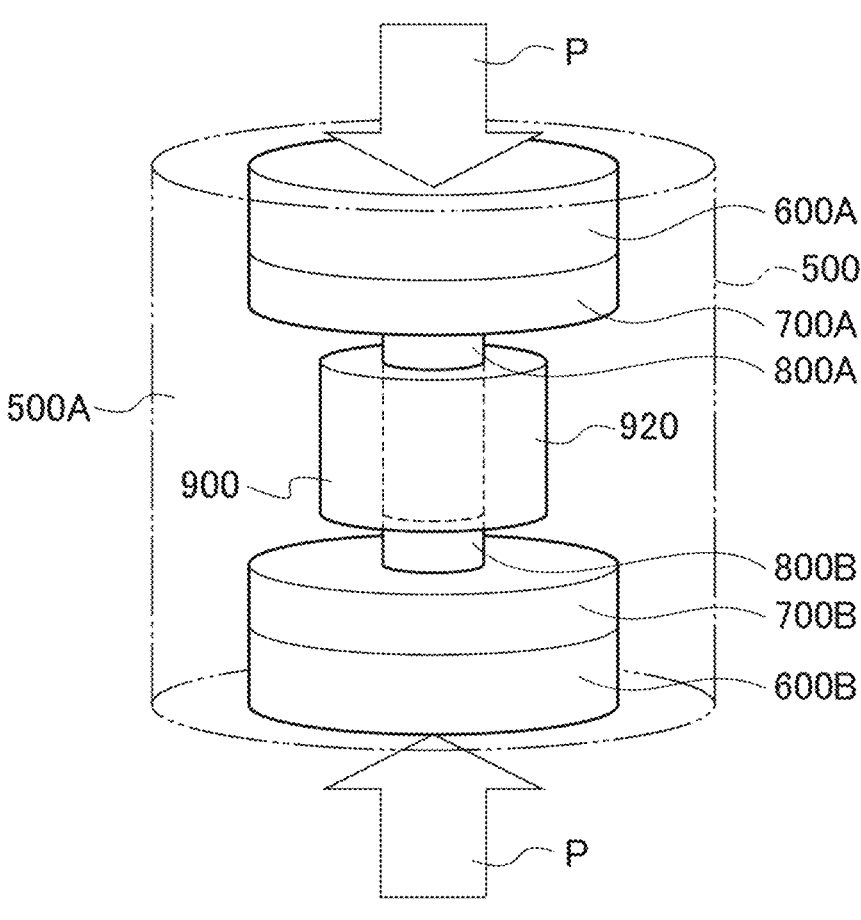
FIG. 9 is a schematic diagram illustrating a fabricating apparatus of a sintered SiC substrate applicable to a fabrication method of the semiconductor substrate according to the embodiments.

FIG. 9 schematically illustrates a fabricating apparatus 500 for a sintered SiC substrate applicable to the fabrication method of the semiconductor substrate according to the embodiments. An inside 500A of the fabricating apparatus 500 is substituted by a vacuum atmosphere of about several Pa or with an Ar/N$_2$ gas.

A solid compression sintering method by hot press (HP) sintering is adopted into the fabricating apparatus 500. A graphite sintering type graphite die 900 filled with a powder or solid SiC polycrystalline body material is heated while being pressurized. A thermocouple or a radiation thermometer 920 is housed in the graphite die 900.

The graphite die 900 is connected to pressing shafts 600A and 600B via graphite bunches 800A and 800B and graphite spacers 700A and 700B. The SiC polycrystalline substance material is pressurized and heated by pressurizing between the pressing shaft 600A and 600B. A heating processing temperature is, for example, a maximum of approximately 1500° C. and an applied pressure P is, for example, a maximum of approximately 280 MPa. It is to be noted that, for example, Spark Plasma Sintering (SPS) may be applied to the hot press (HP) sintering.

According to the fabricating apparatus 500, since a heating range is limited, a rapid temperature increasing and cooling are more possible (several minutes to several hours) than atmosphere heating, such as in an electric furnace. It is possible to fabricate a dense SiC sintered body which suppresses grain growth by pressurizing and rapid temperature increasing. Moreover, it can be applied not only to the sintering but also to sintering bonding, porous body sintering, and the like.

Figure 10:
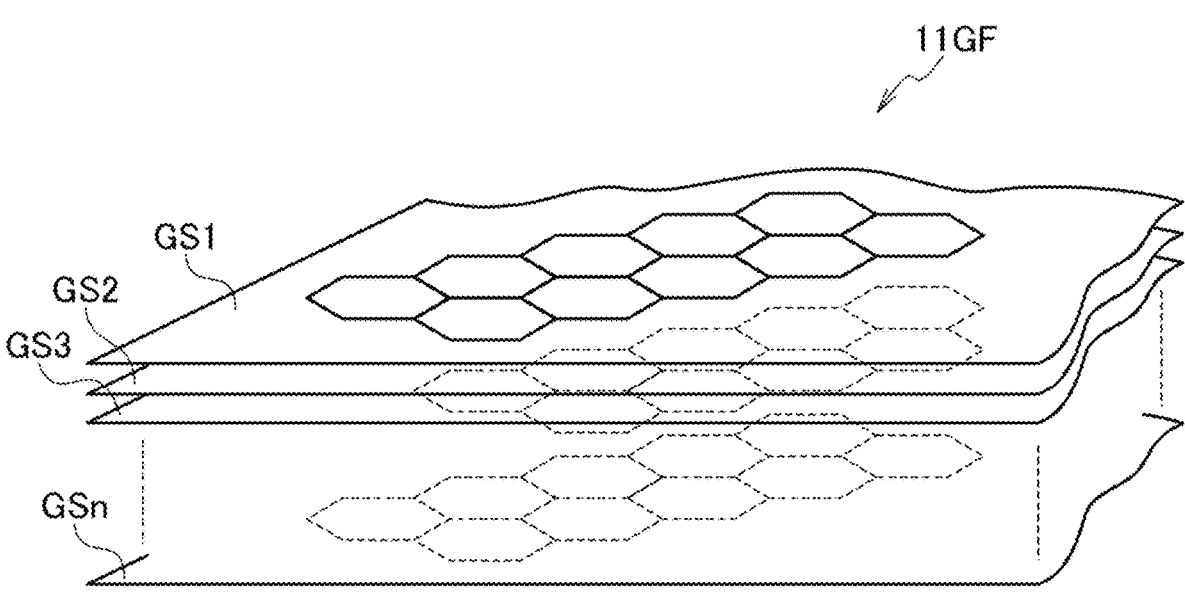
FIG. 10 is a bird's-eye view illustrating an example of a graphene layer applicable to the fabrication method of the semiconductor substrate according to the embodiments, which is provided with a configuration in which a plurality of layers are laminated.
Figure 10:
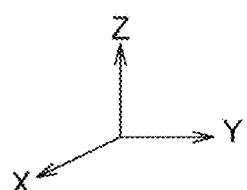

The graphene layers 11GR1, 11GR2, and the like applicable to the fabrication method of the semiconductor substrate according to the embodiments 1 may include a single-layer structure, or may include a configuration obtained by laminating a plurality of layers. FIG. 10 illustrates a bird's-eye view an example of the graphene layer applicable to the fabrication method of the semiconductor substrate according to the embodiments, which is provided with a configuration in which a plurality of layers are laminated.

A graphene layer 11GF provided with a configuration obtained by laminating a plurality of layers includes a laminated structure of graphite sheets GS1, GS2, GS3, . . . , GSn, as illustrated in FIG. 10. The graphite sheets GS1, GS2, GS3, . . . , GSn of respective planes composed of n layers have a large number of hexagonal carbon (C) covalent bonds in one laminated crystal structure, and the graphite sheets GS1, GS2, GS3, . . . , GSn of the respective plane are bonded to each other by Van der Waals force.

The semiconductor substrate 1 according to the embodiments can be applied to fabrication of, for example, various SiC semiconductor elements. The following describes examples of an SiC Schottky Barrier Diode (SiC-SBD), an SiC Trench-gate type Metal Oxide Semiconductor Field Effect Transistor (SiC-TMOSFET), and an SiC planar-gate type MOSFET, as examples of the various SiC semiconductor elements.

(SiC-SBD)

Figure 11:
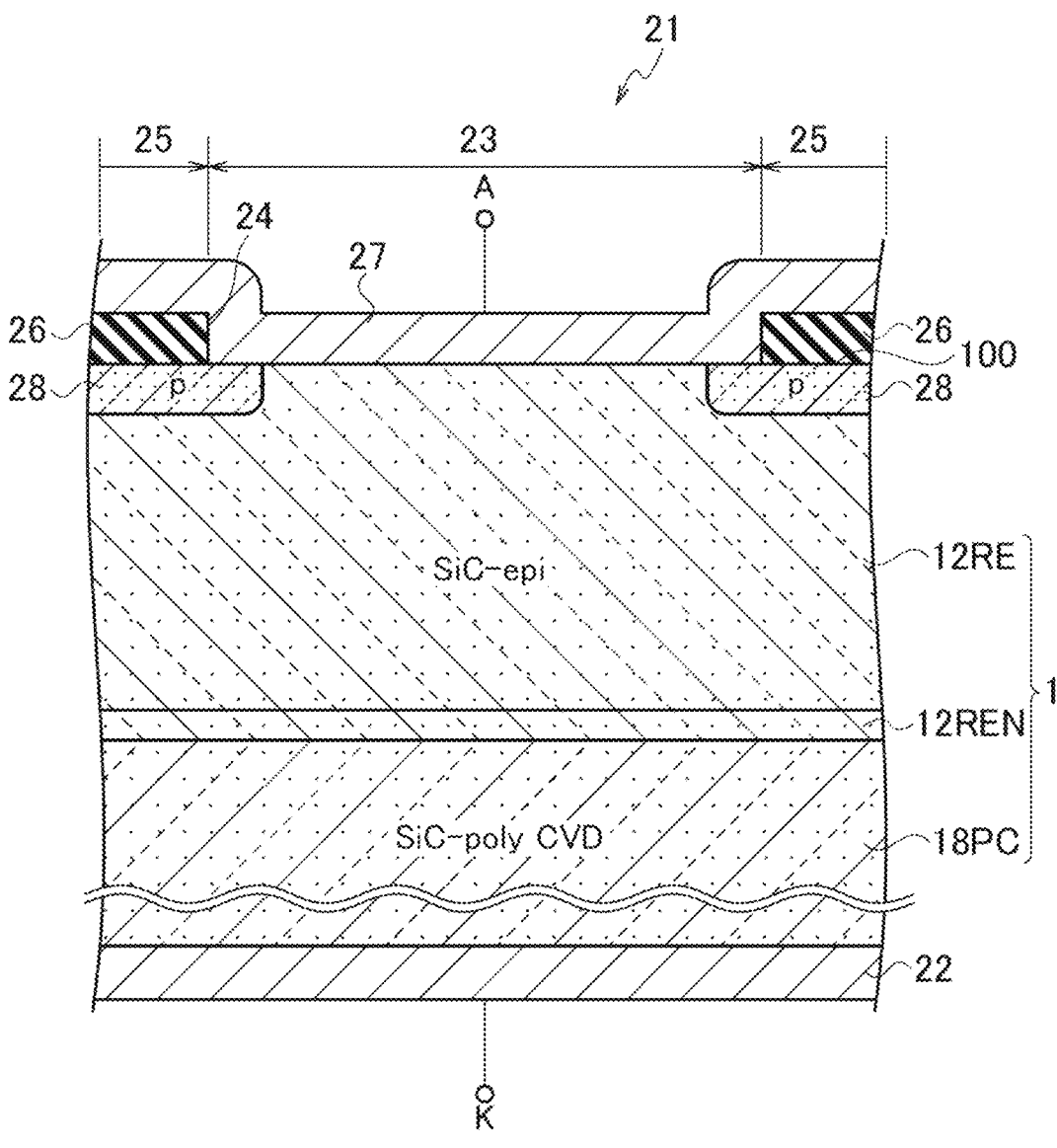
FIG. 11 is a cross-sectional diagram illustrating a Schottky barrier diode fabricated using the semiconductor substrate according to the embodiments.

As a semiconductor device fabricated using the semiconductor substrate according to the embodiments, an SiC-SBD 21 includes a semiconductor substrate 1 including an SiC polycrystalline growth layer (CVD) 18PC and an SiC epitaxial growth layer 12RE, as illustrated in FIG. 11. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1 \times 10^{18}$ $cm^{-3}$ to approximately $1 \times 10^{21}$ $cm^{-3}$), and the SiC epitaxial growth layer 12RE is doped into an $n^-$ type (of which an impurity density is, for example, approximately $5 \times 10^{14}$ $cm^{-3}$ to approximately $5 \times 10^{16}$ $cm^{-3}$). The highly doped layer 12REN is doped at higher concentration than that of the SiC epitaxial growth layer 12RE.

Moreover, the SiC epitaxial growth layer 12RE may contain any one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a cathode electrode 22 so as to cover the whole region of the back side surface, and the cathode electrode 22 is connected to a cathode terminal K.

A front side surface 100 ((0001) Si plane) of the SiC epitaxial growth layer 12 includes a contact hole 24 to which a part of the SiC epitaxial growth layer 12RE is exposed as an active region 23, and a field insulating film 26 is formed at a field region 25 which surrounding the active region 23.

Although the field insulating film 26 includes silicon oxide ($SiO_2$), the field insulating film 26 may include other insulating materials, e.g., silicon nitride (SiN). An anode electrode 27 is formed on the field insulating film 26, and the anode electrode 27 is connected to an anode terminal A.

Near the front side surface 100 (surface portion) of the SiC epitaxial growth layer 12, a p type Junction Termination Extension (JTE) structure 28 is formed so as to be contacted with the anode electrode 27. The JTE structure 28 is formed along an outline of the contact hole 24 so as to extend from the outside to inside of the contact hole 24 of the field insulating film 26.

(SiC-TMOSFET)

Figure 12:
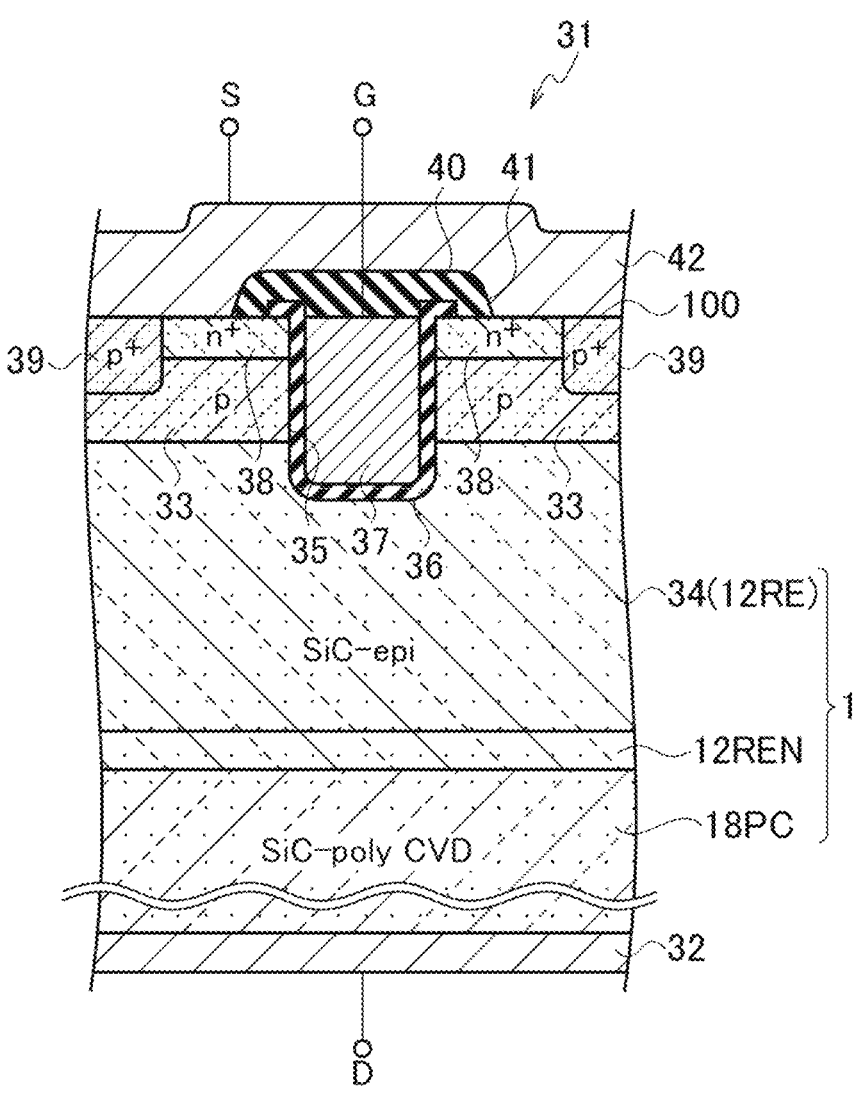
FIG. 12 is a cross-sectional diagram illustrating a trench-gate type MOSFET fabricated using the semiconductor substrate according to the embodiments.

As a semiconductor device fabricated using the semiconductor substrate according to the embodiments, a trench-gate type MOSFET 31 includes a semiconductor substrate 1 including an SiC polycrystalline growth layer 18PC and an SiC epitaxial growth layer 12RE, as illustrated in FIG. 12. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1 \times 10^{18}$ $cm^{-3}$ to approximately $1 \times 10^{21}$ $cm^{-3}$), and the SiC epitaxial growth layer 12RE is doped into an $n^-$ type (of which an impurity density is, for example, approximately $5 \times 10^{14}$ $cm^{-3}$ to approximately $5 \times 10^{16}$ $cm^{-3}$). The highly doped layer 12REN is doped at higher concentration than that of the SiC epitaxial growth layer 12RE.

Moreover, the SiC epitaxial growth layer 12RE may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a drain electrode 32 so as to cover the whole region of the back side surface, and the drain electrode 32 is connected to a drain terminal D.

Near the front side surface 100 ((0001) Si plane) (surface portion) of the SiC epitaxial growth layer 12RE, a p type body region 33 (of which an impurity concentration is, for example, approximately $1 \times 10^{16}$ $cm^{-3}$ to approximately $1 \times 10^{19}$ $cm^{-3}$) is formed. In the SiC epitaxial growth layer 12RE, a portion at a side of the SiC polycrystalline growth layer 18PC with respect to the body region 33 is an $n^-$ type drain region 34 (12RE) where a state of the SiC epitaxial growth layer 12RE is still kept.

A gate trench 35 is formed in the SiC epitaxial growth layer 12RE. The gate trench 35 passes through the body region 33 from the surface 100 of the SiC epitaxial growth layer 12RE, and a deepest portion of the gate trench 35 extends to the drain region 34 (12RE).

A gate insulating film 36 is formed on an inner surface of the gate trench 35 and the surface 100 of the SiC epitaxial growth layer 12RE so as to cover the whole of the inner surface of the gate trench 35. Moreover, a gate electrode 37 is embedded in the gate trench 35 by filling up the inside of the gate insulating film 36 with, for example, polysilicon. A gate terminal G is connected to the gate electrode 37.

An $n^+$ type source region 38 forming a part of a side surface of the gate trench 35 is formed on a surface portion of the body region 33.

Moreover, a $p^+$ type body contact region 39 (of which an impurity concentration is, for example, approximately $1 \times 10^{18}$ $cm^{-3}$ to approximately $1 \times 10^{21}$ $cm^{-3}$) which passes through the source region 38 from the surface 100 and is connected to the body region 33 is formed on the SiC epitaxial growth layer 12RE.

An interlayer insulating film 40 including $SiO_2$ is formed on the SiC epitaxial growth layer 12RE. A source electrode 42 is connected to the source region 38 and the body contact region 39 through a contact hole 41 formed in the interlayer insulating film 40. A source terminal S is connected to the source electrode 42.

A predetermined voltage (voltage equal to or greater than a gate threshold voltage) is applied to the gate electrode 37 in a state where a predetermined potential difference is generated between the source electrode 42 and the drain electrode 32 (between the source and the drain). hereby, a channel can be formed by an electric field from the gate electrode 37 near the interface between the gate insulating film 36 and the body region 33. Thus, an electric current can be flowed between the source electrode 42 and the drain electrode 32, and thereby SiC-TMOSFET 31 can be turned ON state.

(SiC Planar-Gate Type MOSFET)

Figure 13:
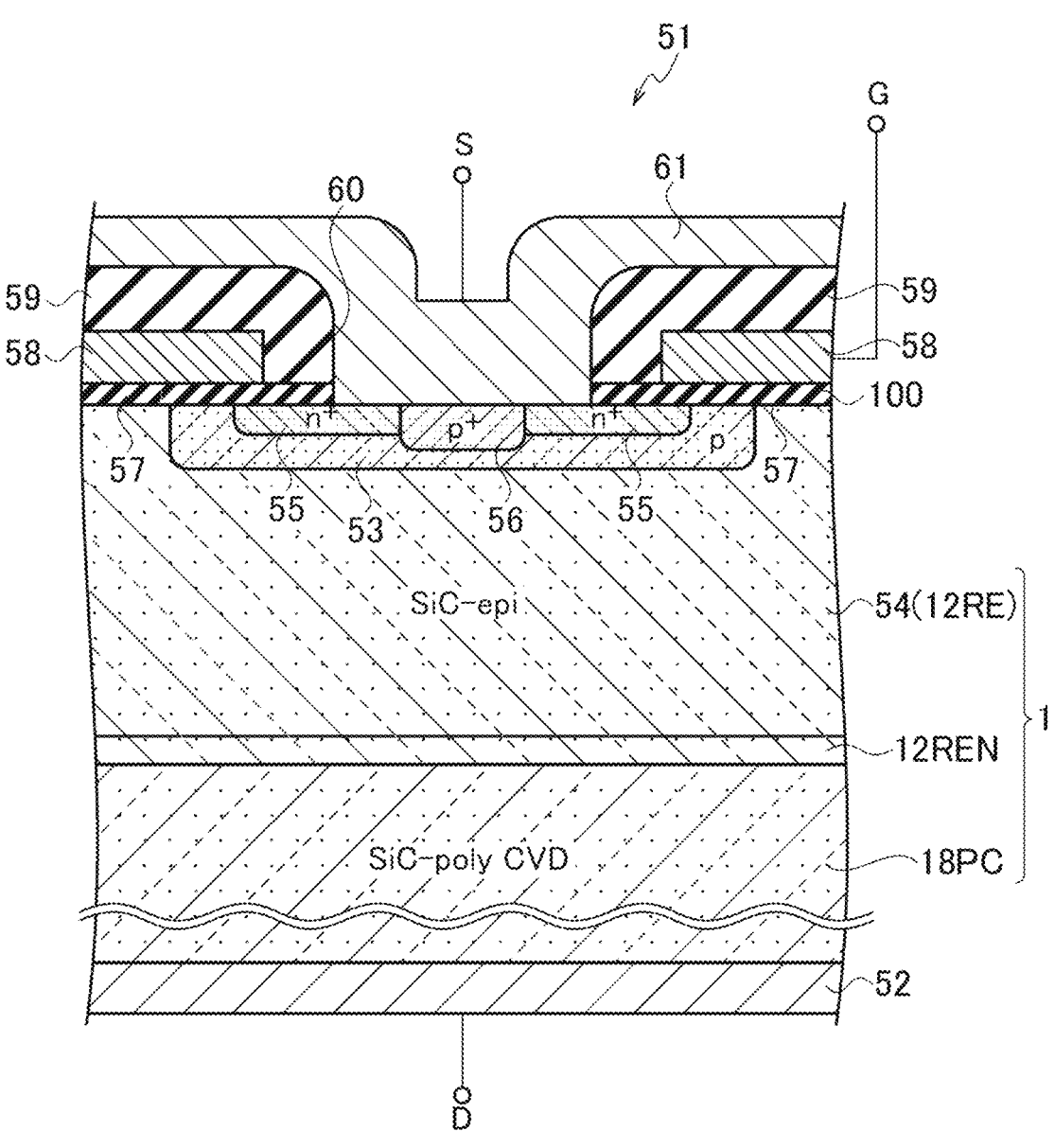
FIG. 13 is a cross-sectional diagram illustrating a planar-gate type MOSFET fabricated using the semiconductor substrate according to the embodiments.

As a semiconductor device fabricated using the semiconductor substrate 1 according to the embodiments, a planar-gate type MOSFET 51 includes a semiconductor substrate 1 including an SiC polycrystalline growth layer 18PC and an SiC epitaxial growth layer 12RE, as illustrated in FIG. 13. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1 \times 10^{18}$ cm$^{-3}$ to approximately $1 \times 10^{21}$ cm$^{-3}$), and the SiC epitaxial growth layer 12RE is doped into an $n^-$ type (of which an impurity density is, for example, approximately $5 \times 10^{14}$ cm$^{-3}$ to approximately $5 \times 10^{16}$ cm$^{-3}$).

Moreover, the SiC epitaxial growth layer 12RE may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC single crystal substrate 10SB includes a drain electrode 52 so as to cover the whole region of the back side surface, and the drain electrode 52 is connected to a drain terminal D.

Near the front side surface 100 ((0001) Si plane) (surface portion) of the SiC epitaxial growth layer 12RE, a p type body region 53 (of which an impurity concentration is, for example, approximately $1 \times 10^{16}$ cm$^{-3}$ to approximately $1 \times 10^{19}$ cm$^{-3}$) is formed in a well shape. In the SiC epitaxial growth layer 12RE, a portion at a side of the SiC single crystal substrate 10SB with respect to the body region 53 is an $n^-$ type drain region 54 (12RE) where a state after the epitaxial growth is still kept.

An $n^+$ type source region 55 is formed on a surface portion of the body region 53 with a certain space from a periphery of the body region 53.

A $p^+$ type body contact region 56 (of which an impurity concentration is, for example, approximately $1 \times 10^{18}$ cm$^{-3}$ to approximately $1 \times 10^{21}$ cm$^{-3}$) is formed inside of the source region 55. The body contact region 56 passes through the source region 55 in a depth direction, and is connected to the body region 53.

A gate insulating film 57 is formed on the front side surface 100 of the SiC epitaxial growth layer 12RE. The gate insulating film 57 covers the portion surrounding the source region 55 in the body region 53 (peripheral portion of the body region 53), and an outer peripheral portion of the source region 55.

A gate electrode 58 including polysilicon, for example, is formed on the gate insulating film 57. The gate electrode 58 is opposed to the peripheral portion of the body region 53 so as to sandwich the gate insulating film 57. A gate terminal G is connected to the gate electrode 58.

An interlayer insulating film 59 including $SiO_2$ is formed on the SiC epitaxial growth layer 12RE. A source electrode 61 is connected to the source region 55 and the body contact region 56 through a contact hole 60 formed in the interlayer insulating film 59. A source terminal S is connected to the source electrode 61.

A predetermined voltage (voltage equal to or greater than a gate threshold voltage) is applied to the gate electrode 58 in a state where a predetermined potential difference is generated between the source electrode 61 and the drain electrode 52 (between the source and the drain). Thereby, a channel can be formed by an electric field from the gate electrode 58 near the interface between the gate insulating film 57 and the body region 53. Thus, an electric current can be flowed between the source electrode 61 and the drain electrode 52, and thereby the planar-gate type MOSFET 51 can be turned ON state.

Although the embodiments have been explained above, the embodiment can also be implemented with other configurations.

For example, although illustration is omitted, an MOS capacitor can also be fabricated using the semiconductor substrate 1 according to the embodiments. According to such MOS capacitors, a yield and reliability can be improved.

Moreover, although illustration is omitted, bipolar junction transistors can also be fabricated using the semiconductor substrate 1 according to the embodiments. In addition, the semiconductor substrate 1 according to the embodiments can also be used for fabrication of SiC pn diodes, SiC IGBTs, SiC complementary MOSFETs, and the like. Moreover, the semiconductor substrate 1 according to the embodiments can also be applied to other type devices such as Light Emitting Diodes (LEDs) and Semiconductor Optical Amplifiers (SOAs), for example.

(Crystal Plane)

Figures 14A, 14B:
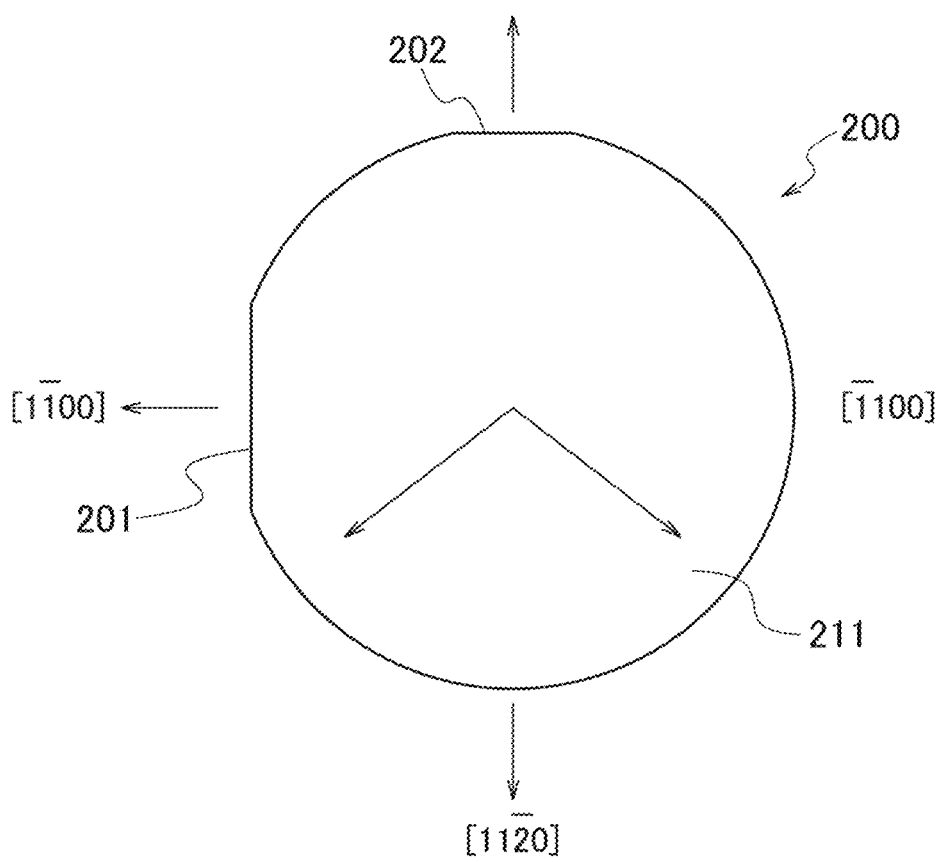
FIG. 14A is a top view diagram for explaining a crystal plane of SiC.
FIG. 14B is a side view diagram for explaining the crystal plane of SiC.

FIG. 14 is a diagram for explaining a crystal plane of SiC. FIG. 14A is a top view diagram illustrating an Si plane 211 of an SiC wafer 200 on which a primary orientation flat 201 and a secondary orientation flat 202 are formed. In the side view diagram observed from the orientation of [−1100] illustrated in FIG. 14B, an Si plane 211 of the orientation of [0001] is formed on an upper surface, and a C plane 212 of an orientation of [000-1] is formed on a lower surface.

Figure 15:
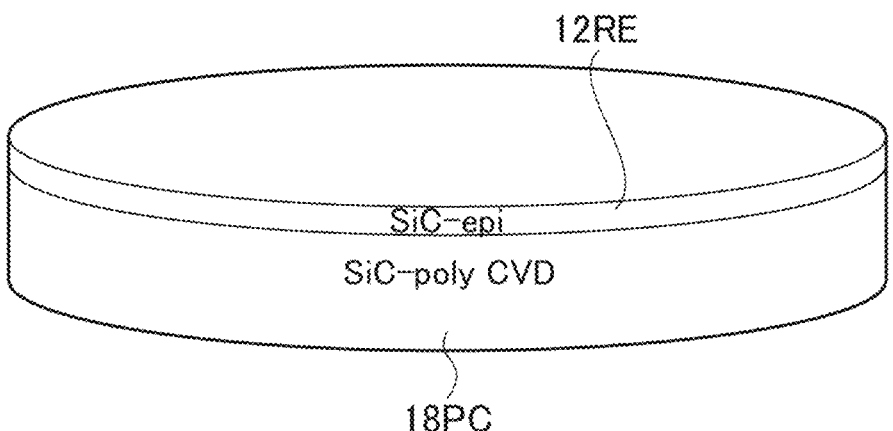
FIG. 15 is a bird's-eye view illustrating a semiconductor substrate (wafer) according to the embodiments.

A schematic bird's-eye view configuration of the semiconductor substrate (wafer) 1 according to the embodiments includes an SiC polycrystalline growth layer 18PC and an SiC epitaxial growth layer 12RE, as illustrated in FIG. 15.

A thickness of the SiC polycrystalline growth layer 18PC is, for example, approximately 200 μm to approximately 500 μm, and a thickness of the SiC epitaxial growth layer 12RE is, for example, approximately 4 μm to approximately 100 μm.

(Example of Crystal Structure)

Figures 16A, 16B, 16C:
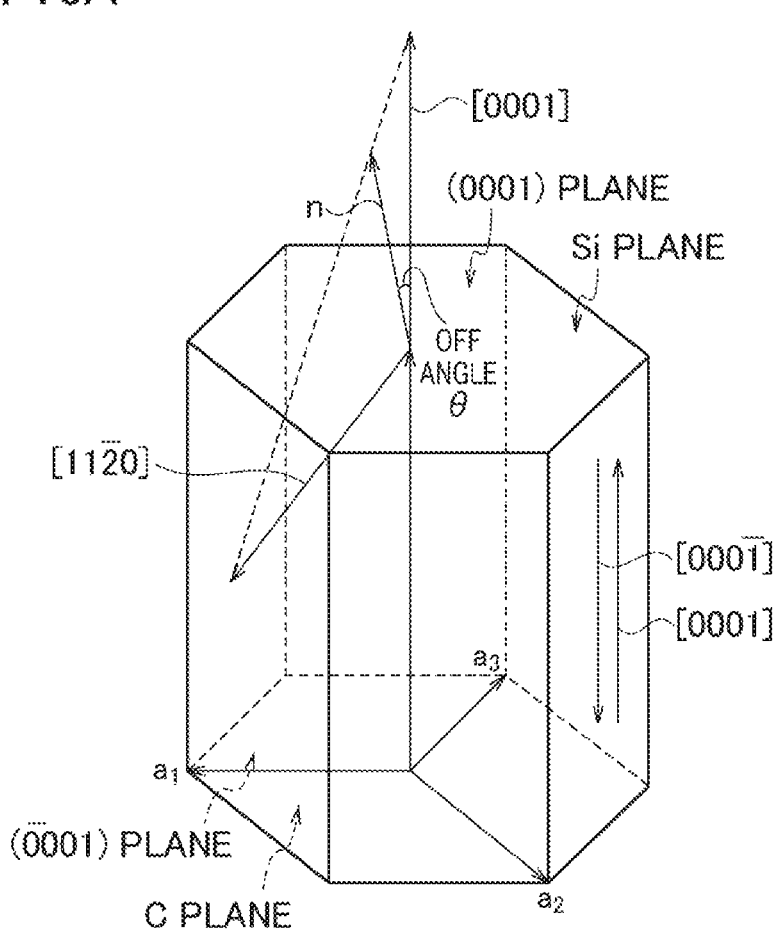
FIG. 16A is a bird's-eye view illustrating a unit cell of 4H—SiC crystal applicable to an SiC epitaxial substrate for the semiconductor substrate according to the embodiments.
FIG. 16B is a configuration diagram of a two-layer portion of the 4H—SiC crystal.
FIG. 16C is a configuration diagram of a four-layer portion of the 4H—SiC crystal.

FIG. 16A illustrates a schematic bird's-eye view configuration of a unit cell of a 4H—SiC crystal applicable to the SiC epitaxial growth layer 12RE, FIG. 16B illustrates a schematic configuration of a two layer portion of the 4H—SiC crystal, and FIG. 16C illustrates a schematic configuration of four layer portion of the 4H—SiC crystal.

Figure 17:
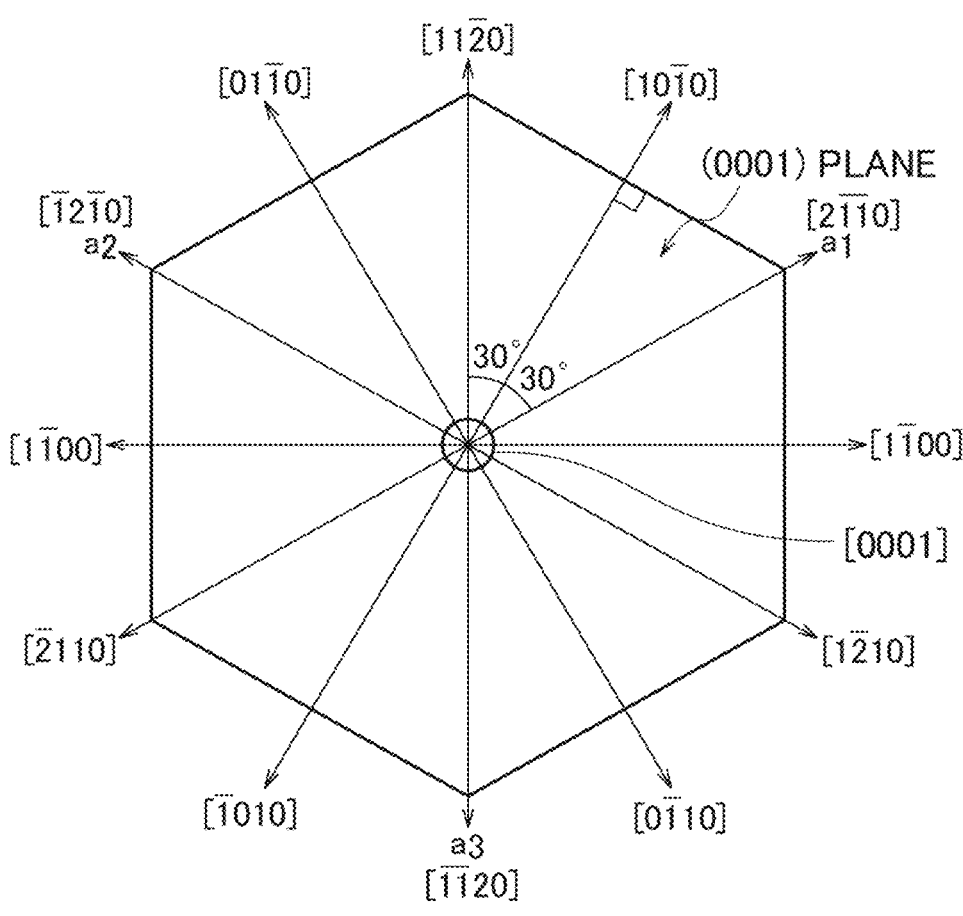
FIG. 17 is a configuration diagram illustrating the unit cell of the 4H—SiC crystal illustrated in FIG. 16A as observed from directly above the (0001) plane.

Moreover, FIG. 17 illustrates a schematic configuration of the unit cell of the 4H—SiC crystal structure of illustrated in FIG. 16A observed from directly above the (0001) plane.

As illustrated in FIGS. 16A to 16C, the crystal structure of the 4H—SiC can be approximated with a hexagonal system, and four C atoms are bound with respect to one Si atom. The four C atoms are positioned at four vertexes of a regular tetrahedron in which the Si atom is disposed at a center thereof. In the four C atoms, one Si atom is positioned in [0001] axial direction with respect to the C atom, and other three C atoms are positioned at a [000-1] axis side with respect to the Si atom. In FIG. 16A, an off angle $\theta$ is equal to or less than approximately 4 degrees.

The [0001] axis and [000-1] axis are along the axial direction of the hexagonal prism, and a plane (top plane of the hexagonal prism) using the [0001] axis as a normal line is (0001) plane (Si plane). On the other hand, a plane (bottom plane of the hexagonal prism) using the [000-1] axis as a normal line is (000-1) plane (C plane).

Moreover, directions vertical to the [0001] axis, and passing along the vertexes not adjacent with one another in the hexagonal prism observed from directly above the (0001) plane are respectively a1 axis [2-1-10], a2 axis [-12-10], and a3 axis [-1-120].

As shown in FIG. 17, a direction passing through the vertex between the a1 axis and the a2 axis is [11-20] axis, a direction passing through the vertex between the a2 axis and the a3 axis is [-2110] axis, and a direction passing through the vertex between the a3 axis and the a1 axis is [1-210] axis.

The axes which are incline at an angle of 30 degrees with respect to each axis of the both sides, and used as the normal line of each side surface of the hexagonal prism, between each of the axes of the above-mentioned six axes passing through the respective vertexes of the hexagonal prism, are respectively [10-10] axis, in the clockwise direction sequentially from between the a1 axis and the [11-20] axes, [1-100] axis, [0-110] axis, [-1010] axis, [-1100] axis, and [01-10] axis. Each plane (side plane of the hexagonal prism) using these axes as the normal line is a crystal plane right-angled to the (0001) plane and the (000-1) plane.

The SiC epitaxial growth layer 12RE may include at least one type or a plurality of types semiconductor(s) selected from a group consisting of group IV semiconductors, group III-V compound semiconductors, and group II-VI compound semiconductors.

Moreover, the SiC single crystal substrate 10SB and the SiC epitaxial growth layer 12RE may contain any one material selected from a group consisting of 4H—SiC, 6H—SiC, and 2H—SiC materials.

In addition, the SiC single crystal substrate 10SB and the SiC epitaxial growth layer 12RE may contain at least one type selected from a group consisting of GaN, BN, AlN, $Al_2O_3$, $Ga_2O_3$, diamond, carbon, and graphite, as other materials except for SiC.

The semiconductor device including the semiconductor substrate according to the embodiments may include any one of GaN-based, AlN-based, and gallium-oxide-based IGBTs, diodes, MOSFETs, and thyristors, except for SiC-based devices.

The semiconductor device including the semiconductor substrate according to the embodiments may include a configuration of any one of a 1-in-1 module, a 2-in-1 module, a 4-in-1 module, a 6-in-1 module, a 7-in-1 module, an 8-in-1 module, a 12-in-1 module, or a 14-in-1 module.

In accordance with the semiconductor substrate according to the embodiments, it is possible to use, for example, a low cost SiC polycrystalline substrate, instead of a high cost SiC single crystalline substrate, as a substrate material.

OTHER EMBODIMENTS

As explained above, the embodiments have been described, as a disclosure including associated description and drawings to be construed as illustrative, not restrictive. It will be apparent to those skilled in the art from the disclosure that various alternative embodiments, examples and implementations can be made.

Such being the case, the embodiments cover a variety of embodiments and the like, whether described or not.

INDUSTRIAL APPLICABILITY

The semiconductor substrate of the present embodiments and the power semiconductor device including such a semiconductor substrate can be used for semiconductor module techniques, e.g., IGBT modules, diode modules, MOS modules (SiC, GaN, AlN, Gallium oxide), and the like; and can be applied to a wide range of application fields such as power modules for inverter circuits that drive electric motors used as power sources for electric vehicles (including hybrid vehicles), trains, industrial robots and the like or power modules for inverter circuits that convert electric power generated by other power generators (particularly, private power generators) such as solar cells and wind power generators into electric power of a commercial power source.

What is claimed is:

1. An SiC semiconductor substrate, comprising:
an SiC single crystal substrate having an Si plane;
a first graphene layer formed directly on the Si plane of the SiC single crystal substrate;
an SiC epitaxial layer disposed above the SiC single crystal substrate via the first graphene layer, and having an Si plane; and
a second graphene layer having a first surface formed directly on the Si plane of the SiC epitaxial layer, and a second surface opposed to the first surface and having a flat surface on an entirety of the second surface.

2. The SiC semiconductor substrate according to claim 1, further comprising
an SiC polycrystalline substrate that is provisionally bonded to the SiC epitaxial layer via the second graphene layer.

3. The SiC semiconductor substrate according to claim 1, wherein
the first graphene layer comprises a single-layer structure or multi-layer laminated structure of graphene.

4. The SiC semiconductor substrate according to claim 2, wherein
the first graphene layer comprises a single-layer structure or multi-layer laminated structure of graphene.

5. The SiC semiconductor substrate according to claim 2, wherein
the SiC polycrystalline substrate comprises a sintered SiC substrate or a CVD substrate.

6. The SiC semiconductor substrate according to claim 1, wherein
the SiC single crystal substrate can be reused by being removed from the SiC epitaxial layer.

7. The SiC semiconductor substrate according to claim 2, wherein the SiC single crystal substrate can be reused by being removed from the SiC epitaxial layer.

8. The SiC semiconductor substrate according to claim 3, wherein the SiC single crystal substrate can be reused by being removed from the SiC epitaxial layer.

9. The SiC semiconductor substrate according to claim 4, wherein the SiC single crystal substrate can be reused by being removed from the SiC epitaxial layer.

10. The SiC semiconductor substrate according to claim 1, further comprising an SiC polycrystalline layer grown by CVD on a C plane of the SiC epitaxial layer, wherein the SiC epitaxial layer is transferred to the SiC polycrystalline layer.

11. The SiC semiconductor substrate according to claim 2, further comprising an SiC polycrystalline layer grown by CVD on a C plane of the SiC epitaxial layer, wherein the SiC epitaxial layer is transferred to the SiC polycrystalline layer.

12. The SiC semiconductor substrate according to claim 3, further comprising an SiC polycrystalline layer grown by CVD on a C plane of the SiC epitaxial layer, wherein the SiC epitaxial layer is transferred to the SiC polycrystalline layer.

13. The SiC semiconductor substrate according to claim 1, wherein the SiC single crystal substrate comprises any one crystal structure selected from a group consisting of 4H—SiC, 6H—SiC, and 2H—SiC crystal structures.

14. The SiC semiconductor substrate according to claim 10, further comprising a doped layer formed between the SiC epitaxial layer and the SiC polycrystalline layer, the doped layer having a higher impurity concentration than that of the SiC epitaxial layer.

15. A fabrication method of an SiC semiconductor substrate, comprising:

forming a first graphene layer directly on an Si plane of an SiC single crystal substrate serving as a basis;

epitaxially growing a first layer formed of a single-crystal SiC semiconductor via the first graphene layer;

forming a second graphene layer directly on an Si plane of the first layer, the second graphene layer having a first surface formed directly on the Si plane of the first layer, and a second surface opposed to the first surface and having a flat surface on an entirety of the second surface;

forming a polycrystal SiC semiconductor substrate via the second graphene layer;

removing the single crystal substrate serving as the basis from the first graphene layer;

eliminating the first graphene layer to expose a C plane of the first layer;

forming a second layer on the C plane of the first layer by CVD growth;

removing the polycrystal SiC semiconductor substrate; and eliminating the second graphene layer.

16. The fabrication method of the SiC semiconductor substrate according to claim 15, wherein the epitaxially growing the first layer comprises growing the first layer by remote epitaxy on the single crystal substrate serving as the basis.

17. The fabrication method of the SiC semiconductor substrate according to claim 15, wherein a front side surface of the first layer is an Si plane of [0001] orientation of 4H—SiC, and a C plane of the first layer is a plane of [000-1] orientation of 4H—SiC.

18. The fabrication method of the SiC semiconductor substrate according to claim 15, wherein the forming of the second layer by the CVD growth comprises forming the second layer formed of a polycrystalline SiC semiconductor.

19. The fabrication method of the SiC semiconductor substrate according to claim 15, further comprising, after the exposing of the C plane of the first layer, forming a layer having a higher impurity concentration than that of the first layer on the C plane of the first layer.

20. The fabrication method of the SiC semiconductor substrate according to claim 15, wherein the epitaxially growth of the first layer formed of the single-crystal SiC semiconductor via the first graphene layer comprises forming a layer having a higher impurity concentration than that of the first layer at an initial stage of the epitaxial growth.

* * * * *